United States Patent
Fan et al.

(10) Patent No.: US 11,240,939 B2
(45) Date of Patent: Feb. 1, 2022

(54) HEAT DISSIPATION CONTROL METHOD, APPARATUS, AND DEVICE

(71) Applicant: Lenovo (Beijing) Co., Ltd., Beijing (CN)

(72) Inventors: Jui-Chan Fan, Beijing (CN); Jeng-Meng Lai, Beijing (CN)

(73) Assignee: LENOVO (BEIJING) CO., LTD., Beijing (CN)

(*) Notice: Subject to any disclaimer, the term of this patent is extended or adjusted under 35 U.S.C. 154(b) by 108 days.

(21) Appl. No.: 16/727,299

(22) Filed: Dec. 26, 2019

(65) Prior Publication Data
US 2020/0214179 A1 Jul. 2, 2020

(30) Foreign Application Priority Data
Dec. 26, 2018 (CN) .......................... 201811608069.7

(51) Int. Cl.
  *H05K 7/20* (2006.01)
  *G05B 19/4155* (2006.01)
  *G06F 1/20* (2006.01)

(52) U.S. Cl.
  CPC ..... *H05K 7/20836* (2013.01); *G05B 19/4155* (2013.01); *G06F 1/206* (2013.01); *H05K 7/20736* (2013.01); *G05B 2219/37211* (2013.01)

(58) Field of Classification Search
  CPC ...... G05B 19/4155; G05B 2219/37211; H05K 7/20736; H05K 7/20836; H05K 7/20209; G06F 11/3055; G06F 11/3058; G06F 1/20; G06F 1/206; G06F 1/28; Y02D 10/00
  USPC ................................... 700/300; 713/300, 320
  See application file for complete search history.

(56) References Cited

U.S. PATENT DOCUMENTS

| | | | | |
|---|---|---|---|---|
| 10,653,044 | B2* | 5/2020 | Chainer | H05K 7/20836 |
| 2006/0054713 | A1* | 3/2006 | Wang | H05K 7/20209 236/49.3 |
| 2006/0095796 | A1* | 5/2006 | Chotoku | G06F 1/206 713/300 |
| 2010/0023787 | A1* | 1/2010 | Ho | G06F 1/206 713/320 |
| 2010/0083018 | A1* | 4/2010 | Park | G06F 1/3206 713/320 |
| 2012/0166015 | A1* | 6/2012 | Steinbrecher | G06F 1/206 700/300 |
| 2012/0185711 | A1* | 7/2012 | Parker | G06F 1/203 713/320 |
| 2014/0114496 | A1* | 4/2014 | Berry | F04D 27/00 700/299 |
| 2014/0240919 | A1* | 8/2014 | Alshinnawi | H05K 7/20145 361/679.49 |

(Continued)

FOREIGN PATENT DOCUMENTS

| CN | 102486180 A | 6/2012 |
|---|---|---|
| CN | 108571460 A | 9/2018 |

*Primary Examiner* — Chun Cao
(74) *Attorney, Agent, or Firm* — Anova Law Group, PLLC

(57) ABSTRACT

A heat dissipation control method includes determining a total power consumption of a heat generating component and a heat dissipating component, determining a heat dissipation parameter based on the total power consumption of the heat generating component and the heat dissipating component, and controlling an operating state of the heat dissipating component based on the heat dissipation parameter.

18 Claims, 4 Drawing Sheets

(56) References Cited

U.S. PATENT DOCUMENTS

2014/0371924 A1* 12/2014 Kodama ................ G05D 23/19
                                                                             700/276
2015/0143147 A1* 5/2015 Park ...................... G06F 1/3234
                                                                             713/320

* cited by examiner

HEAT DISSIPATION CONTROL METHOD, APPARATUS, AND DEVICE

CROSS-REFERENCE TO RELATED APPLICATION

This application claims the priority to Chinese Patent Application No. 201811608069.7, entitled "Heat Dissipation Control Method, Apparatus and Electronic device," filed on Dec. 26, 2018, the entire content of which is incorporated herein by reference.

TECHNICAL FIELD

The present disclosure relates to a heat dissipation control method, an apparatus, and a device.

BACKGROUND

In the heat dissipation control design of an electronic device such as a server system, generally, at least one heat dissipation parameter for heat dissipation of the heat generating component, such as a target temperature, is set, so that a heat dissipating component automatically changes the control parameter of the heat dissipation based on the temperature of the heat generating component. For example, changing the speed of the fan can control the temperature of the heating generating component to stay below certain limit. However, this approach does not optimize system power consumption.

SUMMARY

According to one aspect of the present disclosure, a heat dissipation control method is provided. The heat dissipation control method includes determining a total power consumption of a heat generating component and a heat dissipating component, determining a heat dissipation parameter based on the total power consumption of the heat generating component and the heat dissipating component, and controlling an operating state of the heat dissipating component based on the heat dissipation parameter.

In some embodiments, determining a heat dissipation parameter includes determining one or more heat dissipation parameters. Each heat dissipation parameter corresponds to a threshold range, and each threshold range corresponds to an operating state of the heat dissipating component. In some embodiments, controlling an operating state of the heat dissipating component based on the heat dissipation parameter includes controlling an operating state of the heat dissipating component to operate in the corresponding threshold range in response to a specific parameter of the heat generating component reaching a corresponding threshold range.

In some embodiments, controlling an operating state of the heat dissipating component includes controlling the heat dissipating component to be in an active state or an inactive state, controlling a quantity of one or more heat dissipating components in the active state, and controlling one or more operation parameters of the one or more heat dissipating components in the active state.

In some embodiments, the heat dissipation parameter includes a target temperature, and the specific parameter includes a temperature of the heat generating component.

In some embodiments, an operating state of the heat dissipating component includes a rotational speed of a fan; and controlling an operating state of the heat dissipating component based on the heat dissipation parameter includes adjusting the fan to operate at a rotational speed corresponding to the heat dissipation parameter.

In some embodiments, the heat dissipating component includes a heat conducting medium for cooling; and controlling an operating state of the heat dissipating component based on the heat dissipation parameter includes adjusting an operation parameter of the heat dissipating component based on the heat dissipation parameter, enabling an internal energy change caused by compressing the heat conductive medium to satisfy a cooling requirement.

According to another aspect of the present disclosure, a heat dissipation control apparatus is provided. The heat dissipation control apparatus includes: one or more processors; and a memory for storing one or more programs. The one or more processors execute instructions from the one or more programs to: determine a total power consumption of a heat generating component and a heat dissipating component; determine a heat dissipation parameter based on the total power consumption of the heat generating component and the heat dissipating component; and control an operating state of the heat dissipating component based on the heat dissipation parameter.

In some embodiments, the processor determines one or more heat dissipation parameters. Each heat dissipation parameter corresponds to a threshold range, and each threshold range corresponds to an operating state of the heat dissipating component. In response to a specific parameter of the heat generating component reaching a threshold range, the processor controls the heat dissipating component to operate in an active state corresponding to the threshold range.

In some embodiments of the heat dissipation control apparatus, the heat dissipation parameter includes a target temperature, and the specific parameter includes a temperature of the heat generating component.

In some embodiments of the heat dissipation control apparatus, an operating state of the heat dissipating component includes a rotational speed of a fan, and the processor adjusts the fan to operate at a rotational speed corresponding to the heat dissipation parameter.

In some embodiments of the heat dissipation control apparatus, the heat dissipating component includes a heat conducting medium for cooling, and the processor adjusts an operation parameter of the heat dissipating component based on the heat dissipation parameter, enabling an internal energy change caused by compressing the heat conductive medium to satisfy a cooling requirement.

According to another aspect of the present disclosure, an electronic device is provided. The electronic device includes: a processor; and a memory for storing one or more computer programs that, when executed by the processor, causing the processor to: determine a total power consumption of the heat generating component and the heat dissipating component; determine a heat dissipation parameter based on the total power consumption of the heat generating component and the heat dissipating component; and control an operating state of the heat dissipating component based on the heat dissipation parameter.

In some embodiments of the electronic device, the processor determines one or more heat dissipation parameters. Each heat dissipation parameter corresponding to a threshold range, and each threshold range corresponding to an operating state of the heat dissipating component. In response to a specific parameter of the heat generating component reaching a threshold range, the processor controls the heat dissipating component to operate in an active state corresponding to the threshold range.

In some embodiments of the electronic device, the processor is further configured to: control the heat dissipating component to be in an active state or an inactive state; control a quantity of one or more heat dissipating components in the active state; and control one or more operation parameters of the one or more heat dissipating components in the active state.

In some embodiments of the electronic device, the heat dissipation parameter includes a target temperature, and the specific parameter includes a temperature of the heat generating component.

In some embodiments of the electronic device, an operating state of the heat dissipating component includes a rotational speed of a fan; and the processor adjusts the fan to operate at a rotational speed corresponding to the heat dissipation parameter.

In some embodiments of the electronic device, the heat dissipating component includes a heat conducting medium for cooling; and the processor adjusts an operation parameter of the heat dissipating component based on the heat dissipation parameter, enabling an internal energy change caused by compressing the heat conductive medium to satisfy a cooling requirement.

The above aspects will be described in detail with accompanying drawings.

BRIEF DESCRIPTION OF THE DRAWINGS

For a more complete understanding of the present disclosure and its advantages, reference will now be made to the following descriptions.

DETAILED DESCRIPTION OF THE EMBODIMENTS

Figure 1:
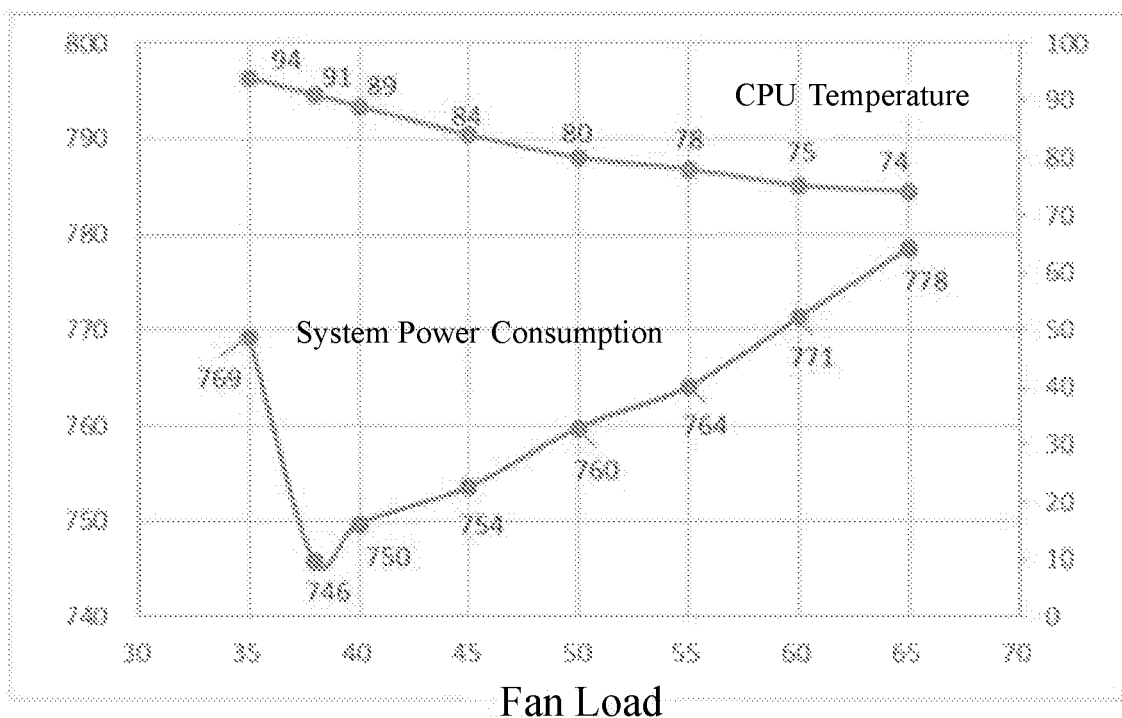
FIG. 1 is a schematic diagram of a processor temperature and a system power consumption, both as a function of a fan load.

Hereinafter, embodiments of the present disclosure will be described with reference to the drawings. It should be understood, however, that the description is only illustrative, and is not intended to limit the scope of the present disclosure. In the following detailed description, numerous specific details are set forth. However, it is apparent that one or more embodiments may be practiced without these specific details. In addition, descriptions of well-known structures and techniques are omitted in the following description in order to avoid unnecessarily obscuring the concept of the present disclosure.

The terminology used herein is for the purpose of describing the particular embodiments, but not to limit the present disclosure. The use of the terms "comprising", "including", etc., is to illustrate the features, procedures, step and/or the existence of a component, but not to exclude the existence of or add one or more other features, procedures, steps, or components.

All terms used herein, including technical and scientific terms, have the meaning commonly understood by one of ordinary skill in the art, unless otherwise defined. It should be noted that the terms used herein are to be interpreted as having a meaning consistent with the context of the present disclosure and should not be interpreted in an ideal or too rigid manner.

Where an expression similar to "at least one of A, B, and C, etc." is used, it should generally be interpreted in accordance with the meaning of the expression as commonly understood by those skilled in the art. For example, "having A, B, and C" or "Systems of at least one of" shall include, but are not limited to, systems having A alone, B alone, C alone, A and B, A and C, B and C, and/or A, B, C, etc. Where an expression similar to "at least one of A, B or C, etc." is used, it should generally be interpreted according to the meaning of the expression as commonly understood by those skilled in the art. For example, "having A, B or C" or "Systems of at least one of" shall include, but are not limited to, systems having A alone, B alone, C alone, A and B, A and C, B and C, and/or A, B, C, etc.

Some block diagrams and/or flowcharts are shown in the drawings. It will be understood that some blocks or combinations of the block diagrams and/or flowcharts can be implemented by computer program instructions. These computer program instructions may be provided to a general purpose computer, a special purpose computer or a processor of other programmable data processing apparatus such that when executed by the processor, the instructions may be used to implement the functional or operating apparatus illustrated in the block diagrams and/or flowcharts. The techniques of the present disclosure may be implemented in the form of hardware and/or software including firmware, microcode, etc. Additionally, the techniques of the present disclosure may take the form of a computer program product on a computer readable storage medium, storing instructions for use by or in connection with an instruction execution system.

FIG. 1 schematically illustrates a schematic diagram of a processor temperature and a system power consumption, both as a function of a fan load.

In a heat dissipation control design of an electronic device such as a server system, generally, at least one heat dissipation parameter for heat dissipation of a heat generating component, such as a target temperature, may be set, so that a heat dissipating component automatically may change a control parameter of the heat dissipation based on a temperature of the heat generating component, for example, changing a rotational speed of a fan to maintain the temperature of the heating generating component below certain limit.

As shown in FIG. 1, the heat generating component may be, for example, a central processing unit CPU, and the heat dissipating component may be, for example, a fan. For example, a target temperature of 80° C. may be set. When the CPU temperature is higher than 80° C., the fan may be operating at a first rotational speed. When the CPU temperature is lower than 80° C., the fan may be operating at a second rotational speed, and the second rotational speed is lower than the first rotational speed, so that the temperature of the CPU can be maintained below 80° C. Of course, a trigger temperature for changing a speed of the fan can be different from the target temperature. For example, the speed of the fan can be increased when the temperature reaches 78° C., to maintain the CPU temperature below 80° C.

However, this approach cannot achieve optimization of a system power consumption. Under this circumstance, as shown in FIG. 1, when the system is composed of a CPU and a fan, although the power consumption of the CPU is reduced, the total system power consumption may be, i.e., 760 units, which is not the lowest value of the system power consumption, due to the increasing power consumption of the fan caused by the increased rotational speed of the fan. In fact, the system power consumption may reach a lowest value, i.e., 746 units, when the CPU temperatures is at 91 degrees.

According to certain embodiments of the present disclosure, a heat dissipation control method is provided. The heat dissipation control method may include: determining a total power consumption of a heat generating component and a heat dissipating component; and determining a heat dissipation parameter based on the total power consumption of the heat generating component and the heat dissipating component, and controlling an operating state of the heat dissipating component based on the heat dissipation parameter.

Figure 2:
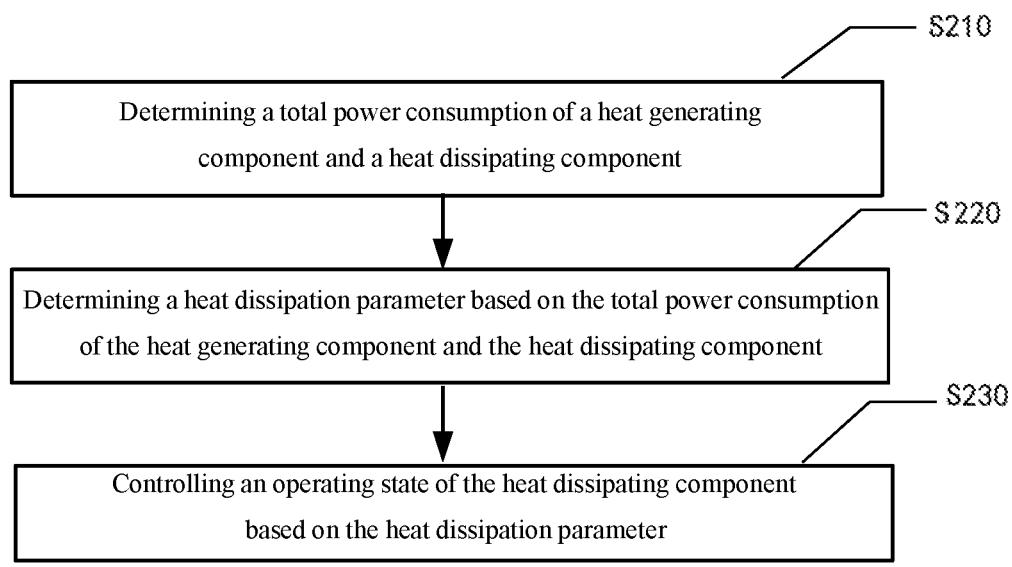
FIG. 2 is a flow chart of a heat dissipation control method according to certain embodiments of the present disclosure.

FIG. 2 schematically illustrates a flow chart of a heat dissipation control method.

According to certain embodiments, as shown in FIG. 2, the method may include steps S210 to S230.

In step S210, the total power consumption of the heat generating component and the heat dissipating component may be determined.

In step S220, a heat dissipation parameter may be determined based on the total power consumption of the heat generating component and the heat dissipating component.

In step S230, an operating state of the heat dissipating component may be controlled based on the heat dissipation parameter.

According to certain embodiments of the present disclosure, for example, when a fan is used as a heat dissipating component to dissipate the heat generated by a processor of the heat generating component, the operating state of the fan may be controlled by a heat dissipation parameter, and the heat dissipation parameter may be determined by the total power consumption of the fan and the processor.

In the method of the present disclosure, the total power consumption of the heat generating component and the heat dissipating component may be comprehensively considered, to achieve the technical effect of optimizing the system power consumption.

According to certain embodiments of the present disclosure, determining the heat dissipation parameter may include determining one or more heat dissipation parameters, each heat dissipation parameter corresponding to a threshold range, and each threshold range corresponding to an operating state of the heat dissipating component. The controlling the operating state of the heat dissipating component based on the heat dissipation parameter may include: when a value of a specific parameter of the heat generating component reaches a corresponding threshold range, controlling the heat dissipating component to operate in an operating state corresponding to that threshold range.

According to certain embodiments of the present disclosure, the heat dissipation parameter may include, for example, a target temperature. The specific parameter may include, for example, a temperature of the heat generating component.

For example, at least one target temperature, for example 80° C., may be set. The target temperature may correspond to a threshold range, for example, greater than 80° C.; and the threshold range may correspond to an operating state of the heat dissipating component, for example, the rotational speed of the fan may be the first rotational speed. When a temperature of the processor reaches above 80° C., that is, the specific parameter of the heating generating component reaches the corresponding threshold range, the fan may be controlled to operate at the first rotational speed.

Alternatively, a plurality of target temperatures may be set, for example, 80° C., 70° C., and 60° C.; and each target temperature may correspond to a threshold range, for example, 80° C. or higher, 70° C. to 80° C., and 60° C. to 70° C., respectively. Each threshold range may correspond to an operating state of the heat dissipating component, for example, the rotational speed of the fan may be the first rotational speed, the second rotational speed, and the third rotational speed. When the temperature of the processor reaches a certain threshold range, the fan may be controlled to operate at a corresponding speed.

According to certain embodiments of the present disclosure, controlling an operating state of the heat dissipating component may include controlling the heat dissipating component to be in an active state or an inactive state, for example, controlling a start and a stop of the fan; and when the temperature of the heat generating component is low, controlling the fan to be in an inactive state, and after the temperature of the heating generating component is increased, controlling the fan to start to work.

According to certain embodiments of the present disclosure, controlling an operating state of the heat dissipating component may include controlling a quantity of heat dissipating components in an active state. The heat dissipating component may include a plurality of fans, and different numbers of fans may be controlled to operate under different heat dissipation parameters. For example, when the temperature of the processor is between 50° C. and 60° C., controlling one of three fans to operate; when the temperature of the processor is between 60° C. and 70° C., controlling two of the three fans to operate; when the temperature of the processor is above 70° C., controlling all the three fans to operate.

According to certain embodiments of the present disclosure, controlling an operating state of the heat dissipating component may include controlling an operation parameter of the heat dissipating component in an active state.

In some embodiments, the operating state of the heat dissipating component may include a rotational speed of the fan; and controlling the operating state of the heat dissipating component based on the heat dissipation parameter may include adjusting the rotational speed of the fan corresponding to the heat dissipation parameter.

In some embodiments, the heat dissipating component may include a heat conductive medium for cooling, and controlling an operating state of the heat dissipating component based on the heat dissipation parameter may include adjusting an operating parameter of the heat dissipating component based on the heat dissipation parameter, such that the internal energy change caused by a compression of the heat conducting medium may satisfy cooling requirements.

According to certain embodiments of the present disclosure, the heat conductive medium can absorb heat near the heat generating component while dissipating heat at other locations. For example, at other locations, the heat conductive medium may be converted from a gaseous state to a liquid state by compression, thereby releasing heat; in the vicinity of the processor, the heat conductive medium may be converted from a liquid state to a gaseous state by placing the heat conductive medium in a low pressure environment, thereby absorbing heat. According to certain embodiments, different pressures can be controlled to be operating parameters under different heat dissipation parameters, so that the heat absorbing capacity of the heat conductive medium may be different, to achieve different cooling effects.

According to certain embodiments of the present disclosure, system power consumption under different heat dissipation parameters may be separately tested. The system power consumption may include a total power consumption of the heat generating component and the heat dissipating component, determining a heat dissipation parameter corresponding to a lowest system power consumption as a first heat dissipation parameter, and the operating state of the heat dissipation component may be controlled by the first heat dissipation parameter.

For example, when the system is first started, the system power consumption under different thermal parameters may be tested separately. Alternatively, in response to user input, the system power consumption under different thermal parameters can be separately tested. Or, when the system is restarted, the system power consumption under different heat dissipation parameters may be tested. After the apparatus is started, its environment can be relatively stable, and it can be tested when the apparatus is started instead of being tested in the factory, so that the determined first heat dissipation parameter can be suitable for user's actual use environment.

According to certain embodiments of the present disclosure, the first heat dissipation parameter may also be retested at certain specific timings. For example, in the case of obtaining information that the firmware in the system is changed, the system power consumption under different heat dissipation parameters may be separately tested. Alternatively, in the case of obtaining information that the firmware in the system is reset, the system power consumption using different heat dissipation parameters may be separately tested. Or, in the case of obtaining information that a change of an environmental parameter exceeds a preset value, the system power consumption under different heat dissipation parameters may be separately tested. When the firmware changes, or when the environmental parameter changes such as changes in environmental temperatures, the value of the heat dissipation parameter that corresponds to the lowest system power consumption may also change, and re-testing the first heat dissipation parameter may facilitate achieving an optimized power consumption effect in the new environment.

According to certain embodiments of the present disclosure, different first heat dissipation parameters in different operating states may also be recorded. That is, testing the system power consumption under different heat dissipation parameters in a specific operating state; determining the heat dissipation parameter that minimizes the system power consumption in the specific operating state as the first heat dissipation parameter corresponding to the operating state; and when obtaining information that the system in the specific operating state, controlling the heat dissipating component to dissipate the heat from the heat generating component by the first heat dissipation parameter corresponding to the specific operating state.

For example, a user's laptop may often used in a company or at home. Due to the temperature difference between the home and the company, the first heat dissipation parameter that minimizes the total power consumption of the system in different environments may be different, and can be tested separately; and when different environments are detected, the first heat dissipation parameter corresponding to the environment may be adopted.

The present disclosure also provides a heat dissipation control apparatus based on the foregoing concept. According to certain embodiments, the heat dissipation control apparatus will be described below with reference to FIG. 3.

Figure 3:
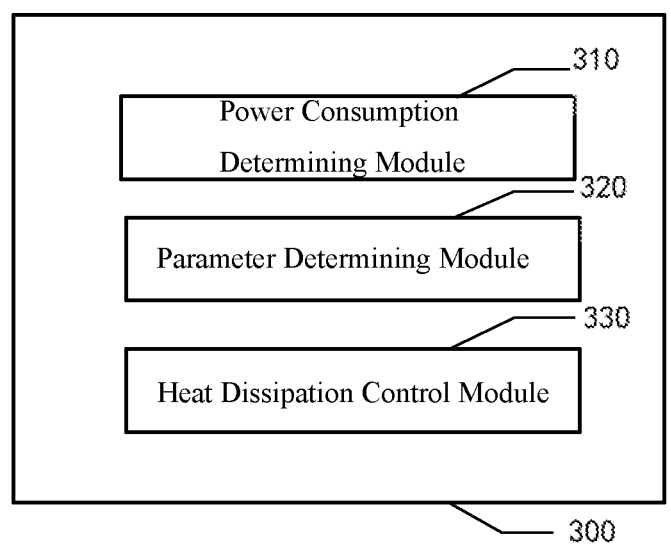
FIG. 3 is a block diagram of a heat dissipation control apparatus according to certain embodiments of the present disclosure.

FIG. 3 schematically shows a block diagram of a heat dissipation control apparatus.

In some embodiments, as shown in FIG. 3, the heat dissipation control apparatus 300 may include: a power consumption determining module 310, a parameter determining module 320, and a heat dissipation control module 330. The heat dissipation control apparatus 300 can perform the various methods as described above.

The power consumption determining module 310 may perform, for example, the foregoing-described step S210, as shown in FIG. 2, for determining the total power consumption of the heat generating component and the heat dissipating component.

The parameter determining module 320 may perform, for example, step S220 described as shown in FIG. 2, for determining a heat dissipation parameter based on a total power consumption of the heat generating component and the heat dissipating component.

The heat dissipation control module 330 may perform, for example, step S230 as shown in FIG. 2, for controlling the operating state of the heat dissipating component based on the heat dissipation parameter.

According to certain embodiments of the present disclosure, the parameter determining module may be configured to determine one or more heat dissipation parameters, each heat dissipation parameter may correspond to a threshold range, and each threshold range may correspond to an operating state of the heat dissipating component. The heat dissipation control module may be configured to control the heat dissipating component to operate in an operation state corresponding to a threshold range when a specific parameter of the heat generating component reaches a corresponding threshold range.

According to certain embodiments of the present disclosure, controlling the operating state of the heat dissipating component may include at least one of: controlling the heat dissipating component to be in an active state or an inactive state, controlling the quantity of the heat dissipating components in the active state, and controlling the operation parameter of the heat dissipating component in the active state.

According to certain embodiments of the present disclosure, the heat dissipation parameter may include a target temperature, and the specific parameter may include a temperature of the heat generating component.

According to certain embodiments of the present disclosure, an operating state of the heat dissipating component may include a rotational speed of the fan, and controlling the operating state of the heat dissipating component based on the heat dissipation parameter may include adjusting a rotational speed of the fan corresponding to the heat dissipation parameter.

According to certain embodiments of the present disclosure, the heat dissipating component may include a heat conductive medium for cooling, and controlling the operating state of the heat dissipating component based on the heat dissipation parameter may include adjusting an operating parameter of the heat dissipating component based on the heat dissipation parameter, so that the internal energy change of the heat transfer medium after absorbing heat from the heat generating component may satisfy a cooling requirement.

According to certain embodiments of the present disclosure, any number of modules, sub-modules, units, sub-units, or at least some of functions of the any number of modules, sub-modules, units, sub-units, may be implemented in one module. According to certain embodiments, any one or more of the modules, sub-modules, units, sub-units may be split into a plurality of modules. In some embodiments, any one or more of the modules, sub-modules, units, sub-units may be implemented at least in part as hardware circuitry, such as a Field Programmable Gate Array (FPGA), a Programmable Logic Array (PLA), system-on-a-chip, system on a substrate, system-in-a-package, an application-specific integrated circuit (ASIC), or any other reasonable means of hardware or firmware that integrates or packages the circuit; or may be implemented through any or a suitable combination of software, hardware, and firmware. Alternatively, in some embodiments, one or more of the modules, sub-modules, units, sub-units may be at least partially implemented as a computer program module that, when executed, can perform corresponding functions.

For example, any number of the power consumption determining module 310, the parameter determining module 320, and the heat dissipation control module 330 may be implemented in one module, or any one of the modules may be split into a plurality of modules. Alternatively, at least some of the functions of the one or more modules may be combined with at least some of the functions of other modules, and implemented in one module. According to certain embodiments of the present disclosure, at least one of the power consumption determining module 310, the parameter determining module 320, and the heat dissipation control module 330 may be at least partially implemented as a hardware circuit, such as a field programmable gate array (FPGA), a programmable logic array (PLA), system-on-a-chip, system on a substrate, system-in-a-package, an application-specific integrated circuit (ASIC), or any other reasonable means of hardware or firmware that integrates or packages the circuit; or may be implemented through any or a suitable combination of software, hardware, and firmware. Alternatively, at least one of the power consumption determining module 310, the parameter determining module 320, and the heat dissipation control module 330 may be at least partially implemented as a computer program module that, when executed, can perform corresponding functions.

Figure 4:
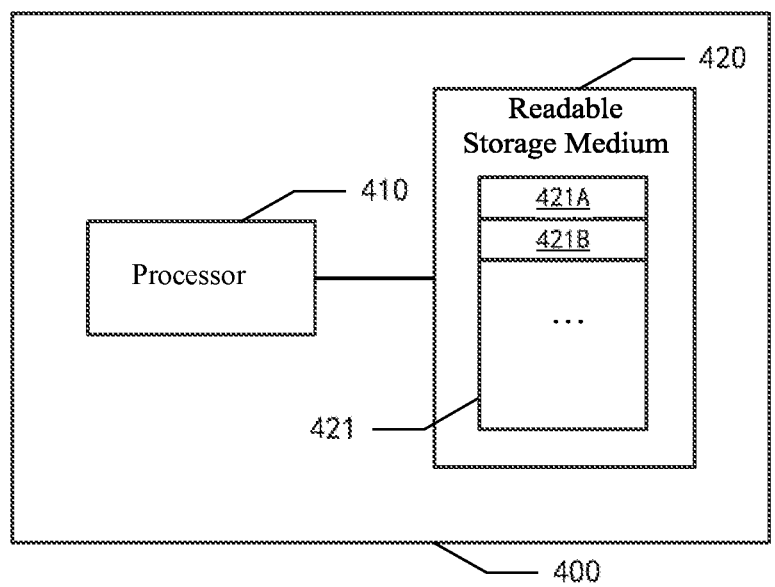
FIG. 4 is a block diagram of an electronic device according to certain embodiments of the present disclosure.

According to certain embodiments of the present disclosure, FIG. 4 schematically illustrates a block diagram of an electronic device 400. A computer system of FIG. 4 is merely an example and should not impose any limitation on the function and scope of use of the embodiments of the present disclosure.

As shown in FIG. 4, electronic device 400 may include a processor 410 and a computer readable storage medium 420. The electronic device 400 can perform the method provided by the present disclosure.

In particular, the processor 410 may include, for example, a general purpose microprocessor, an instruction set processor, and/or a related chipset and/or a special purpose microprocessor, e.g., an application-specific integrated circuit (ASIC). The processor 410 may also include an onboard memory for caching purposes. According to certain embodiments of the present disclosure, the processor 410 may be a single processing unit or a plurality of processing units for performing different steps of the method provided by the present disclosure.

The computer readable storage medium 420 may be, for example, a non-transitory computer readable storage medium, and specific examples may include, but may not be limited to: a magnetic storage apparatus such as a magnetic tape or a hard disk (HDD); an optical storage apparatus such as an optical disk (CD-ROM); a memory such as a random access memory (RAM) or a flash memory.

According to certain embodiments of the present disclosure, the computer readable storage medium 420 may include a computer program 421, the compute program 421 may include code/computer executable instructions that, when executed by the processor 410, cause the processor 410 to perform the method provided by the present disclosure or any variation thereof.

The computer program 421 may be configured to have a computer program code including, for example, a computer program module. For example, in some embodiments, the code in the computer program 421 may include one or more program modules, for example, module 421A, module 421B. It should be noted that division manners and number of modules may not be fixed, and those skilled in the art may use suitable program modules or program module combinations based on actual conditions, such that when these program module combinations are executed by the processor 410, the processor 410 may execute the method provided by the present disclosure or any variation thereof.

According to certain embodiments of the present disclosure, at least one of the power consumption determining module 310, the parameter determining module 320, and the heat dissipation control module 330 may be implemented as a computer program module as shown in FIG. 4, which may implement the foregoing described operations when executed by the processor 410.

The present disclosure also provides a computer readable storage medium, which may be included in the equipment/apparatus/system described in the above embodiments; or may be separately present without being incorporated into such equipment/apparatus/system. The computer readable storage medium described above may carry one or more programs that may, when executed, implement the method provided by the present disclosure.

According to certain embodiments of the present disclosure, the computer readable storage medium may be a non-transitory computer readable storage medium, which may include, but may not be limited to: a portable computer disk, a hard disk, a random access memory (RAM), a read-only memory (ROM), an erasable programmable read-only memory (EPROM or flash memory), a portable compact disk read-only memory (CD-ROM), an optical storage apparatus, a magnetic storage apparatus, or any suitable combination thereof. In the present disclosure, a computer readable storage medium may be any tangible medium that can contain or store a program, which can be used by or in connection with an instruction execution system, apparatus, or component.

The flowchart and block diagrams in the figures illustrate the architecture, functionality, and operation of possible implementations of systems, methods, and computer program products in accordance with various embodiments of the present disclosure. In this regard, each block of the flowchart or block diagrams can represent a module, a program segment, or a portion of code that includes one or more executable instructions. It should also be noted that in certain alternative implementations, functions noted in the blocks may also occur in an order different from that illustrated in the drawings. For example, two successively represented blocks may in fact be executed substantially in parallel, and may, depending upon the functionality involved, sometimes be executed in the reverse order. It is also noted that each block or combinations of blocks of the block diagrams or flowcharts may be implemented by a dedicated hardware-based system that performs specified functions or operations, or may be implemented through a combination of a dedicated hardware and computer instructions.

Those skilled in the art will can appreciate that various combinations of the features of the various embodiments and/or claims of the present disclosure are possible, even if such combinations are not explicitly recited in the present disclosure. In particular, various combinations of the features described in the various embodiments and/or claims of the present disclosure can be made without departing from the spirit and scope of the present disclosure. All such combinations fall within the scope of the present disclosure.

Although the present disclosure has been shown and described with respect to the specific exemplary embodiments of the present disclosure, it will be understood by those skilled in the art that variations in form and detail can be made to the present disclosure. Therefore, the scope of the present disclosure should not be limited to the above-described embodiments, but should be determined not only by the appended claims but also by the equivalents of the appended claims.

What is claimed is:

1. A heat dissipation control method, comprising:
    determining, by a processor of an electronic device, a total power consumption of a heat generating component and a plurality of heat dissipating components, the plurality of heat dissipating components including a number of fans and a heat conductive medium for cooling;
    determining, by the processor, a heat dissipation parameter based on the total power consumption of the heat generating component and the plurality of heat dissipating components; and
    controlling, by the processor, an operating state of one of the plurality of heat dissipating components based on the heat dissipation parameter, wherein the operating state of one of the plurality of heat dissipating components includes an operating state of one or more of the number of fans and an operating state of the heat conductive medium, the operating state of the one or more of the number of fans includes a quantity of fans being in an active state, and the operating state of the heat conductive medium includes a state of the heat conductive medium converted between a gaseous state and a liquid state by pressure adjustment.

2. The method according to claim 1, wherein:
    determining a heat dissipation parameter comprises determining one or more heat dissipation parameters, each heat dissipation parameter corresponding to a threshold range, and each threshold range corresponding to an operating state of the one of the plurality of heat dissipating components; and
    controlling an operating state of the one of the plurality of heat dissipating components based on the heat dissipation parameter comprises in response to a specific parameter of the one of the plurality of heat generating components reaching a corresponding threshold range, controlling an operating state of the one of the plurality of heat dissipating components to operate in the corresponding threshold range.

3. The method according to claim 1, wherein controlling an operating state of one or more of the number of fans further comprises:
    controlling one or more operation parameters of the one or more of the number of fans in the active state.

4. The method according to claim 2, wherein the heat dissipation parameter comprises a target temperature, and the specific parameter comprises a temperature of the one of the plurality of heat generating components.

5. The method according to claim 1, wherein:
    an operating state of the one or more of the number of fans comprises a rotational speed of a fan; and
    controlling an operating state of the one or more of the number of fans based on the heat dissipation parameter comprises adjusting the fan to operate at a rotational speed corresponding to the heat dissipation parameter.

6. The method according to claim 1, wherein:
    controlling an operating state of the heat conductive medium based on the heat dissipation parameter comprises adjusting a pressure of the heat conductive medium based on the heat dissipation parameter, enabling an internal energy change caused by compressing the heat conductive medium to satisfy a cooling requirement.

7. A heat dissipation control apparatus, comprising:
    one or more processors; and
    a memory for storing one or more programs, the one or more processors executing instructions from the one or more programs to:
        determine a total power consumption of a heat generating component and a plurality of heat dissipating components, the plurality of heat dissipating components including a number of fans and a heat conductive medium;
        determine a heat dissipation parameter based on the total power consumption of the heat generating component and the plurality of heat dissipating components; and
        control an operating state of one of the plurality of heat dissipating components based on the heat dissipation parameter, wherein the operating state of one of the plurality of heat dissipating components includes an operating state of one or more of the number of fans and an operating state of the heat conductive medium, the operating state of the one or more of the number of fans includes a quantity of fans being in an active state, and the operating state of the heat conductive medium includes a state of the heat conductive medium converted between a gaseous state and a liquid state by pressure adjustment.

8. The apparatus according to claim 7, wherein:
    the processor determines one or more heat dissipation parameters, each heat dissipation parameter corresponding to a threshold range, and each threshold range corresponding to an operating state of the one of the plurality of heat dissipating components; and
    in response to a specific parameter of the heat generating component reaching a threshold range, the processor controls the one of the plurality of heat dissipating components to operate in an operating state corresponding to the threshold range.

9. The apparatus according to claim 7, wherein the processor is further configured to:
    control one or more operation parameters of the one or more of the number of fans in the active state.

10. The apparatus according to claim 8, wherein the heat dissipation parameter comprises a target temperature, and the specific parameter comprises a temperature of the one of the plurality of heat generating components.

11. The apparatus according to claim 7, wherein:
    an operating state of the one or more of the number of fans comprises a rotational speed of a fan; and the processor adjusts the one or more of the number of fans to operate at a rotational speed corresponding to the heat dissipation parameter.

12. The apparatus according to claim 7, wherein:
the processor adjusts a pressure of the heat conductive medium based on the heat dissipation parameter, enabling an internal energy change caused by compressing the heat conductive medium to satisfy a cooling requirement.

13. An electronic device, comprising:
a processor;
a memory for storing one or more computer programs that, when executed by the processor, causing the processor to:
   determine a total power consumption of the heat generating component and a plurality of heat dissipating components, the plurality of heat dissipating components including a number of fans and a heat conductive medium;
   determine a heat dissipation parameter based on the total power consumption of the heat generating component and the plurality of heat dissipating components; and
   control an operating state of one of the plurality of heat dissipating components based on the heat dissipation parameter, wherein the operating state of one of the plurality of heat dissipating components includes an operating state of one or more of the number of fans and an operating state of the heat conductive medium the operating state of the one or more of the number of fans includes a quantity of fans being in an active state, and the operating state of the heat conductive medium includes a state of the heat conductive medium converted between a gaseous state and a liquid state by pressure adjustment.

14. The electronic device according to claim 13, wherein:
the processor determines one or more heat dissipation parameters, each heat dissipation parameter corresponding to a threshold range, and each threshold range corresponding to an operating state of the one of the plurality of heat dissipating components; and
in response to a specific parameter of the heat generating component reaching a threshold range, the processor controls the one of the plurality of heat dissipating components to operate in an operating state corresponding to the threshold range.

15. The electronic device according to claim 13, wherein the processor is further configured to:
control one or more operation parameters of the one or more of the number of fans in the active state.

16. The electronic device according to claim 14, wherein the heat dissipation parameter comprises a target temperature, and the specific parameter comprises a temperature of the one of the plurality of heat generating components.

17. The electronic device according to claim 13, wherein:
an operating state of the one or more of the number of fans comprises a rotational speed of a fan; and
the processor adjusts the one or more of the number of fans to operate at a rotational speed corresponding to the heat dissipation parameter.

18. The electronic device according to claim 13, wherein:
the processor adjusts a pressure of the heat conductive medium based on the heat dissipation parameter, enabling an internal energy change caused by compressing the heat conductive medium to satisfy a cooling requirement.

* * * * *